(12) United States Patent
Akram et al.

(10) Patent No.: US 7,002,248 B2
(45) Date of Patent: *Feb. 21, 2006

(54) SEMICONDUCTOR COMPONENTS HAVING MULTIPLE ON BOARD CAPACITORS

(75) Inventors: Salman Akram, Boise, ID (US); Mike Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/887,255

(22) Filed: Jul. 7, 2004

(65) Prior Publication Data

US 2004/0238957 A1    Dec. 2, 2004

Related U.S. Application Data

(63) Continuation of application No. 10/226,472, filed on Aug. 23, 2002, now Pat. No. 6,891,248.

(51) Int. Cl.
*H01L 23/34* (2006.01)
(52) U.S. Cl. .................................. 257/724; 257/532
(58) Field of Classification Search ............... 257/532, 257/723, 724, 691, 778, 758
See application file for complete search history.

(56) References Cited

U.S. PATENT DOCUMENTS

| | | | | |
|---|---|---|---|---|
| 4,260,444 A | * | 4/1981 | Fowler | 156/252 |
| 4,322,778 A | * | 3/1982 | Barbour et al. | 361/794 |
| 4,758,926 A | * | 7/1988 | Herrell et al. | 361/699 |
| 4,803,595 A | * | 2/1989 | Kraus et al. | 361/784 |
| 5,177,594 A | * | 1/1993 | Chance et al. | 257/678 |
| 5,739,045 A | | 4/1998 | Cronin et al. | |
| 5,807,762 A | | 9/1998 | Akram et al. | |
| 5,844,419 A | | 12/1998 | Akram et al. | |
| 5,959,310 A | | 9/1999 | Akram et al. | |
| 5,994,759 A | | 11/1999 | Darmawan et al. | |
| RE36,469 E | | 12/1999 | Wood et al. | |
| 6,002,180 A | | 12/1999 | Akram et al. | |
| 6,011,314 A | | 1/2000 | Leibovitz et al. | |
| RE36,613 E | | 3/2000 | Ball | |
| 6,043,109 A | * | 3/2000 | Yang et al. | 438/113 |
| 6,077,723 A | | 6/2000 | Farnworth et al. | |
| 6,118,179 A | | 9/2000 | Farnworth et al. | |
| 6,175,241 B1 | | 1/2001 | Hembree et al. | |
| 6,184,568 B1 | | 2/2001 | Protigal et al. | |
| 6,258,623 B1 | | 7/2001 | Moden et al. | |
| 6,274,937 B1 | | 8/2001 | Ahn et al. | |
| 6,281,578 B1 | | 8/2001 | Lo et al. | |
| 6,285,080 B1 | * | 9/2001 | Bezama et al. | 257/738 |
| 6,512,298 B1 | | 1/2003 | Sahara et al. | |
| 6,555,921 B1 | | 4/2003 | Kwon et al. | |
| 6,586,273 B1 | | 7/2003 | Aiba et al. | |
| 6,590,295 B1 | | 7/2003 | Liao et al. | |
| 6,623,985 B1 | | 9/2003 | Igarshi | |

(Continued)

Primary Examiner—S. V. Clark
(74) Attorney, Agent, or Firm—Stephen A. Gratton

(57) ABSTRACT

A semiconductor component includes a semiconductor die, and an on board capacitor on the die for filtering transient voltages, spurious signals and power supply noise in signals transmitted to the die. The capacitor includes a first electrode in electrical communication with a first terminal contact for the component, and a second electrode in electrical communication with a second terminal contact for the component. The electrodes are separated by a dielectric layer and protected by an outer protective layer of the component. The capacitor can be fabricated using redistribution layers on a wafer containing multiple dice. The component can be used to construct systems such as multi chip packages and multi chip modules.

36 Claims, 7 Drawing Sheets

U.S. PATENT DOCUMENTS

| | | |
|---|---|---|
| 6,706,584 B1 | 3/2004 | List et al. |
| 6,771,786 B1 * | 8/2004 | Skindhøj et al. ............ 381/324 |
| 6,794,098 B1 | 9/2004 | Kubacki |
| 6,800,930 B1 * | 10/2004 | Jackson et al. ............. 257/700 |
| 6,891,248 B1 | 5/2005 | Akram et al. |
| 2004/0012081 A1 * | 1/2004 | Kwon ........................ 257/678 |
| 2004/0036157 A1 | 2/2004 | Akram et al. |
| 2004/0212099 A1 * | 10/2004 | Klein et al. ................. 257/778 |

* cited by examiner

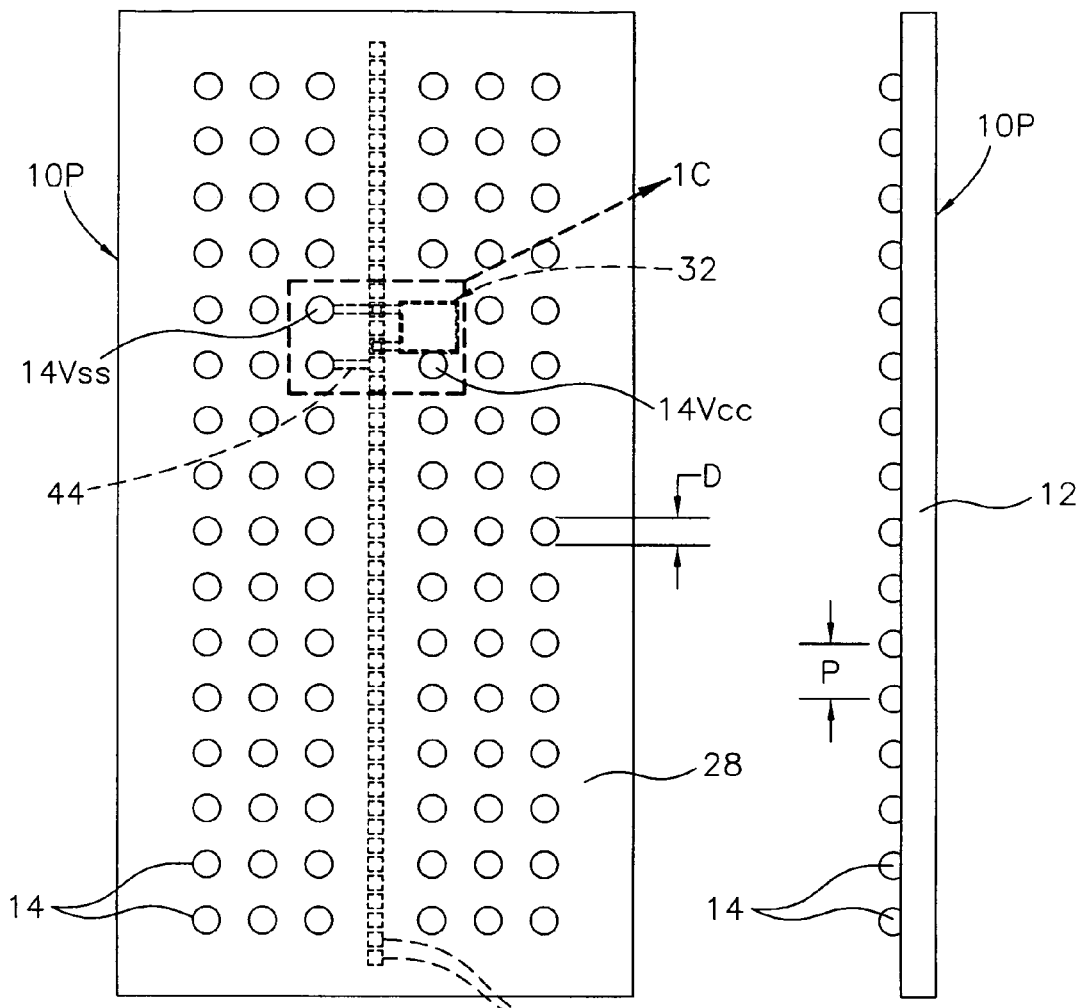
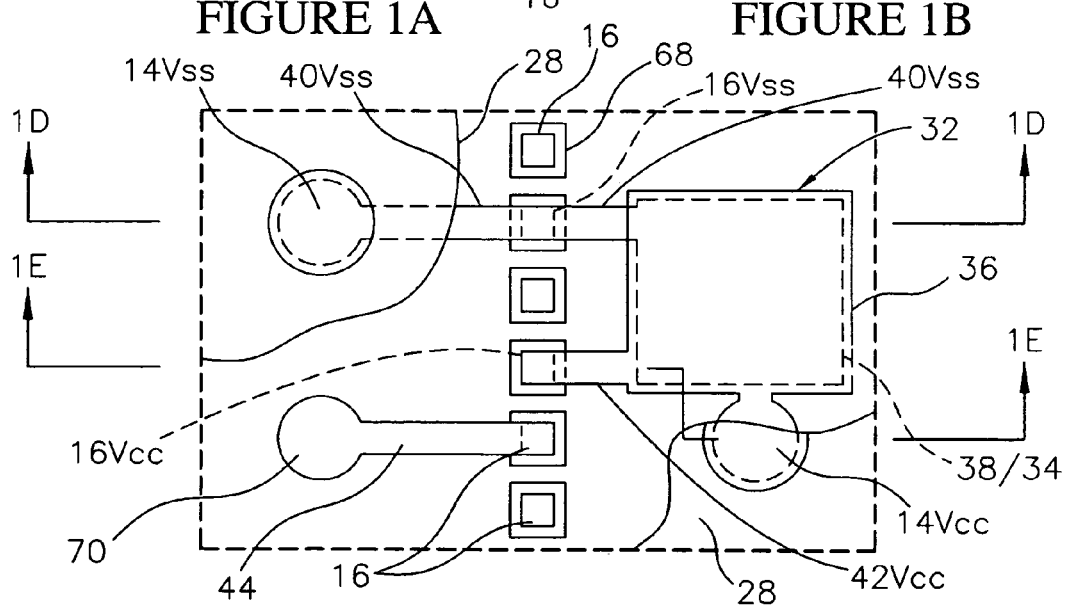
FIGURE 1A
FIGURE 1B
FIGURE 1C

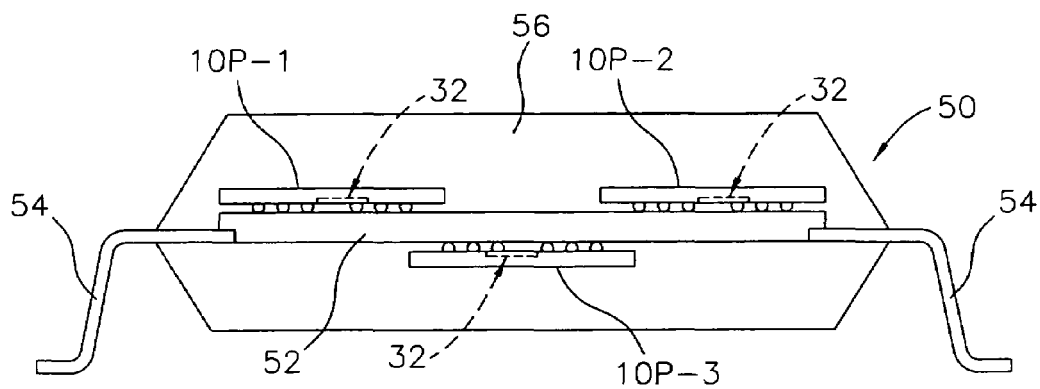
FIGURE 2A
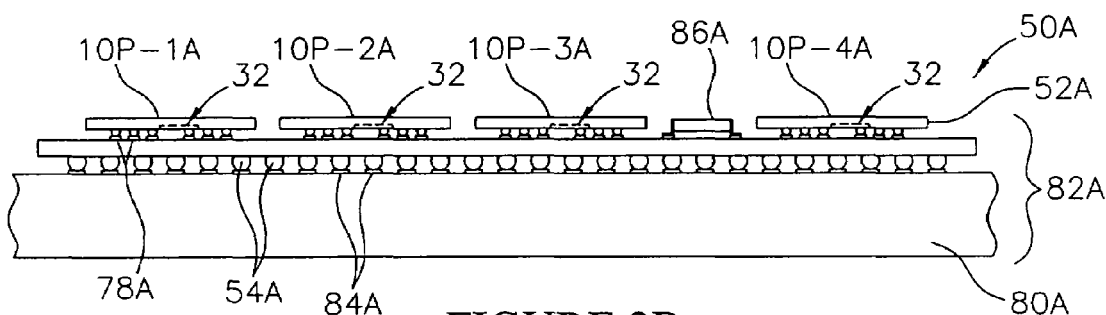
FIGURE 2B
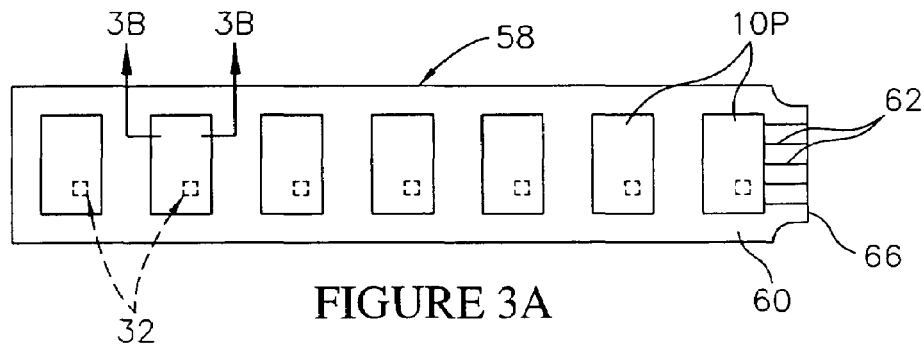
FIGURE 3A
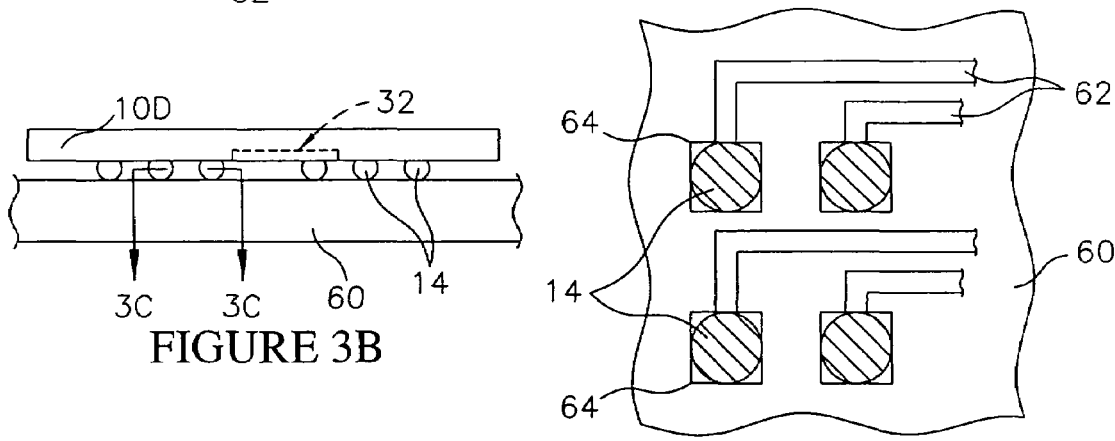
FIGURE 3B
FIGURE 3C

SEMICONDUCTOR COMPONENTS HAVING MULTIPLE ON BOARD CAPACITORS

CROSS REFERENCE TO RELATED APPLICATIONS

This application is a continuation of Ser. No. 10/226,472, filed Aug. 23, 2002, U.S. Pat. No. 6,891,248 B2.

This application is related to Ser. No. 10/723,127, filed Nov. 25, 2003.

FIELD OF THE INVENTION

This invention relates generally to semiconductor manufacture and packaging. More particularly, this invention relates to a semiconductor component having an on board capacitor, to a method for fabricating the component, and to systems incorporating the component.

BACKGROUND OF THE INVENTION

One type of semiconductor package includes several semiconductor components in a single package module. The semiconductor components can be in the form of semiconductor dice, semiconductor packages, or semiconductor wafers. This type of package is sometimes referred to as a multi chip module (MCM) package, or as a system in a package (SIP).

Typically, the MCM package is constructed to provide a system level of functionality, such as a control or memory function. As such, the MCM package can include different types of semiconductor components configured to perform different functions in the system. For example, a MCM package configured as a micro controller can include a microprocessor component, and one or more memory components, such as SRAMs, DRAMs, or flash memories.

MCM packages offer increased system performance, because the integrated circuits on the semiconductor components can be operated more efficiently. This is largely a result of decreasing the interconnection length between the components. In addition, system performance is improved because the input/output ports for the MCM package can be configured to access the whole system, which can be organized to reduce signal delays and access times. The power requirements are also reduced due to a reduction in the driver requirements.

One problem that occurs in the MCM packages results from parasitic inductance. For example, parasitic inductance can result from switching transients and cross coupling between the conductors (e.g., wires or traces) that electrically connect the different components in the MCM package. Parasitic inductance can cause transient voltages, spurious signals, and power supply noise, which degrade the operation of the semiconductor components, and adversely affect the performance of the system. Parasitic inductance can also make testing of the MCM packages more difficult because false readings are obtained, making electrical evaluation of the packages more difficult. Parasitic inductance is particularly a problem at clocking speeds of 500 mHz or more.

One technique for overcoming parasitic inductance is by filtering the transient voltages, spurious signals and power supply noise. For example, external decoupling capacitors can be surface mounted within the MCM packages or on a substrate, such as a circuit board or test board, containing the MCM packages. One problem with these external capacitors is that they are susceptible to shorting, and also to mechanical damage due to their surface mounting. In addition, the conductive paths between the capacitors and the components, or the integrated circuits on the components, can also produce parasitic inductance. As MCM packages, and other systems containing multiple semiconductor components, become more densely populated with components, problems associated with parasitic inductance are increased.

The present invention reduces the problems associated with parasitic inductance by incorporating an on board capacitor into the structure of a component. In addition, the on board capacitor is more durable than conventional surface mount capacitors, is protected by the structure of the component, and is closer to the integrated circuits contained on the component. The present invention is also directed to a novel method for fabricating components with on board capacitors, and to improved systems incorporating the components.

SUMMARY OF THE INVENTION

In accordance with the present invention, a semiconductor component, a method for fabricating the component, and systems incorporating the component are provided. In an illustrative embodiment, the component comprises a semiconductor package containing a single die. The die includes integrated circuits, and die contacts, such as bond pads, in electrical communication with the integrated circuits.

In addition to the die, the component includes an array terminal contacts, and at least one on board capacitor in electrical communication with selected terminal contacts and selected die contacts. The capacitor is configured to filter transient voltages, spurious signals, and power supply noise resulting from parasitic inductance. The capacitor includes a first electrode and a second electrode separated by a dielectric layer. In the illustrative embodiment, the first electrode is in electrical communication with a ground (Vss) die contact, and with a ground (Vss) terminal contact. The second electrode is in electrical communication with a power (Vcc) die contact, and with a power (Vcc) terminal contact.

The fabrication method is preferably performed on a wafer containing multiple semiconductor dice which are made into the components, and then singulated into the separate components. The fabrication method includes the steps of forming the first electrodes on the dice using a first metal layer in contact with the ground (Vss) die contacts, forming a dielectric layer on the first electrodes, and then forming second electrodes on the dice using a second metal layer in contact with the power (Vcc) die contacts. The first metal layer can comprise a portion of a first redistribution layer (RDL1) formed on an electrically insulating layer such as a passivation layer. The dielectric layer can comprise a deposited and cured polymer, and the second metal layer can comprise a portion of a second redistribution layer (RDL2).

The component can be used to construct systems such as MCM packages, and multi chip modules. In an alternate embodiment a wafer component comprises a semiconductor wafer containing multiple dice, with each die having an on board capacitor. The wafer component can be used to construct systems such as circuit boards and modules.

BRIEF DESCRIPTION OF THE DRAWINGS

FIG. 1A is a plan view of a semiconductor component constructed in accordance with the invention;

FIG. 1B is a side elevation view of FIG. 1A;

FIG. 1C is an enlarged, partially cut away portion of FIG. 1A;

FIG. 2A is a schematic cross sectional view of a packaged system incorporating components constructed in accordance with the invention;

FIG. 2B is a schematic cross sectional view of another packaged system incorporating components constructed in accordance with the invention;

FIG. 3A is a plan view of a semiconductor multi chip module incorporating components constructed in accordance with the invention;

FIG. 3B is a schematic cross sectional view taken along section line 3B—3B of FIG. 3A;

FIG. 3C is an enlarged schematic cross sectional view taken along section line 3C—3C of FIG. 3B;

DETAILED DESCRIPTION OF THE PREFERRED EMBODIMENTS

As used herein, the term "semiconductor component" refers to an electronic element that includes a semiconductor die. Exemplary semiconductor components include semiconductor dice, semiconductor packages, semiconductor wafers, BGA devices, multi chip modules and circuit boards.

Referring to FIGS. 1A–1E, a semiconductor component 10P constructed in accordance with the invention is illustrated. In this embodiment, the component 10P comprises a semiconductor package, such as a chip scale package (CSP).

The component 10P includes a semiconductor die 12, and a plurality of terminal contacts 14. The die 12 can comprise a conventional semiconductor die having a desired electrical configuration. For example, the die 12 can be a memory device, such as a DRAM, SRAM or flash memory. In the illustrative embodiment, the component 10P and the die 12 are generally rectangular in shape, but other shapes such as square can be utilized. In addition, the component 10P and the die 12 are substantially the same size, and have matching peripheral outlines.

Figure 1D:
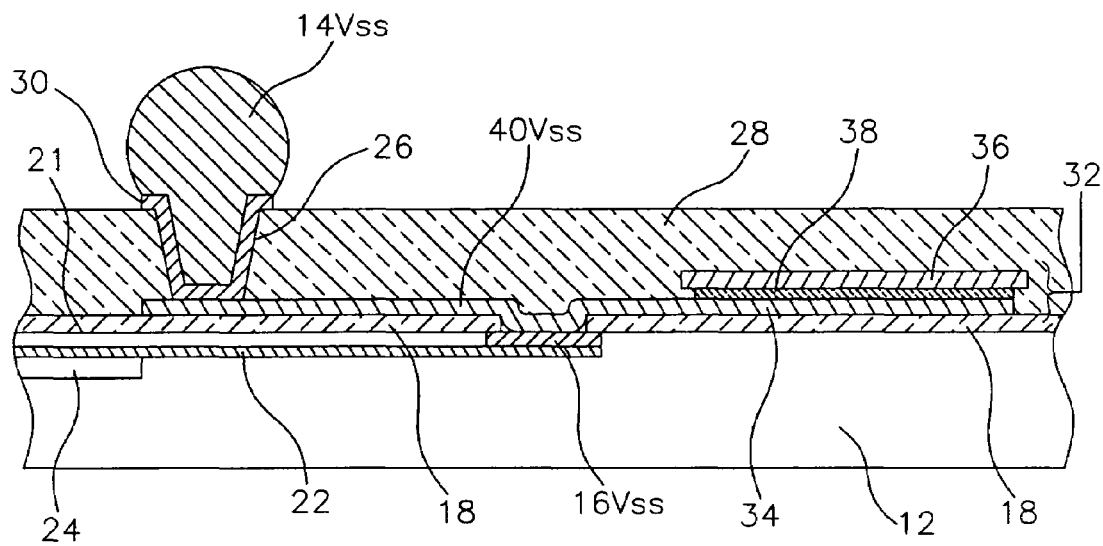
FIG. 1D is an enlarged schematic cross sectional view taken along section line 1D—1D of FIG. 1C.
Figure 1E:
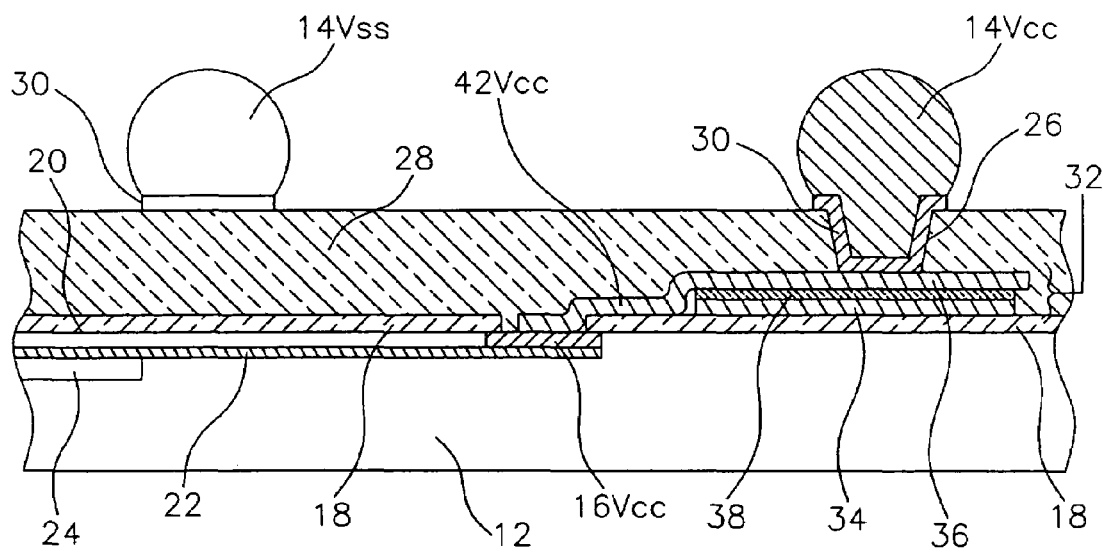
FIG. 1E is an enlarged schematic cross sectional view taken along section line 1E—1E of FIG. 1C.

The die 12 includes a pattern of die contacts 16, such as bond pads embedded within an electrically insulating passivation layer 18 (FIG. 1D). The die contacts 16 and the die passivation layer 18 are located on a face 21 (circuit side) of the die 12, with the die contacts 16 located below the surface of the passivation layer 18. In the illustrative embodiment the die contacts 16 are located along a center line 20 of the die 12, which is also the center line of the component 10P. As shown in FIGS. 1D and 1E, the die 12 also includes internal conductors 22 in electrical communication with the die contacts 16 and with integrated circuits 24 contained on the die 12.

The component 10P also includes an outer protective layer 28. As shown in FIGS. 1D and 1E, the terminal contacts 14 are located in openings 26 formed through the outer protective layer 28. The outer protective layer 28 can comprise a dielectric material adapted to electrically insulate and protect the component 10P.

The terminal contacts 14 can comprise solder bumps, or balls, bonded to under bump metallization layers 30. The terminal contacts 14 provide electrical connection points from the outside world to the integrated circuits 24 and other electrical devices on the component 10P. In the illustrative embodiment, the terminal contacts 14 are arranged in a ball grid array composed of six rows and sixteen columns. However, as is apparent, other dense area arrays, or patterning arrangements, can be used for locating the terminal contacts 14. The terminal contacts 14 permit the component 10P to be flip chip mounted circuit side down to mating electrodes on a supporting substrate, such as a circuit board. Accordingly the component 10P can be referred to as a "flip chip" component.

The component 10P also includes at least one on board capacitor 32 configured to filter transient voltages and spurious signals, such as those produced by parasitic inductance, and to reduce power supply noise. The capacitor 32 thus improves the performance of the component 10P and improves test procedures, such as burn-in conducted on the component 10P. The capacitor 32 is in electrical communication with a ground terminal contact 14Vss, and in electrical communication with a power terminal contact 14Vcc for the component 10P.

As shown in FIGS. 1D and 1E, the capacitor 32 includes a first (lower) electrode 34 and a second (upper) electrode 36 separated by a dielectric layer 38. The first (lower) electrode 34 is in electrical communication with the ground terminal contact 14Vss and with a ground die contact 16Vss. The second (upper) electrode 36 is in electrical communication with the power terminal contact 14Vcc and with a power die contact 16Vcc. As shown in FIG. 1D, a ground conductor 40Vss electrically connects the ground terminal contact 14Vss, the ground die contact 16Vss and the first (lower) electrode 34. As shown in FIG. 1E, a power conductor 42Vcc electrically connects the power terminal contact 14Vcc, the power die contact 16Vcc and the second (upper) electrode 36. In addition, as shown in FIG. 1C, generic conductors 44 electrically connect the remaining terminal contacts 14 to their corresponding die contacts 16 on the die 12.

Further, the component 10P can include multiple capacitors 32 rather than just one capacitor. For example, some dice 12 include multiple power die contacts 16Vcc, such as a 1.8 volt power die contact and a 2.5 volt power die contact.

Each different power die contact 16Vcc, and corresponding power terminal contact 14Vcc, can be in electrical communication with a separate capacitor 32.

Referring to FIG. 2A, a MCM package 50 that includes semiconductor components 10P-1, 10P-2 and 10P-3 constructed in accordance with the invention is illustrated. The MCM package 50 can be configured as a system in a package (SIP) adapted to perform a desired electrical function, such as micro processing. Each semiconductor component 10P-1, 10P-2, 10P-3 includes at least one board capacitor 32, constructed substantially as previously described for semiconductor component 10P (FIG. 1A). However, the components 10P-1, 10P-2, 10P-3 can be configured to perform different electrical functions in the MCM package 50. For example, with the MCM package 50 configured as a micro controller, component 10P-1 can include an SRAM die, component 10P-2 can include a microprocessor die, and component 10P-3 can include a flash memory die.

The on board capacitors 32 contained on the components 10P-1, 10P-2, 10P-3 improve the performance of the MCM package 50 by filtering transient voltages, spurious signals and power supply noise. In addition, the on board capacitors 32 are located close to the integrated circuits 24 (FIG. 1D) on the components 10P-1, 10P-2, 10P-3 such that the function of the capacitors 32 is improved. Specifically, fewer transient voltages and spurious signals are produced in the electrical paths between the capacitors 32, and the integrated circuits 24 than with prior art external capacitors.

The MCM package 50 also includes a substrate 52 wherein the components 10P-1, 10P-2, 10P-3 are mounted using flip chip technology. The substrate 52 includes electrodes and conductors which electrically connect the components 10P-1, 10P-2, 10P-3 in a required electrical configuration. The substrate 52 also includes external leads 54, such as shaped pins, in electrical communication with the components 10P-1, 10P-2, 10P-3. The MCM package 50 also includes a package body 56 formed of a cured plastic or other suitable material, which encapsulates the substrate 52 and the components 10P-1, 10P-2, 10P-3.

Referring to FIG. 2B, a MCM package 50A that includes semiconductor components 10P-1A, 10P-2A, 10P-3A, 10P-4A constructed in accordance with the invention is illustrated. The MCM package 50A can be configured as a system in a package (SIP) adapted to perform a desired electrical function such as micro processing. Each semiconductor component 10P-1A, 10P-2A, 10P-3A, 10P-4A includes at least one board capacitor 32, constructed substantially as previously described for semiconductor component 10P (FIG. 1A).

The MCM package 50A also includes a substrate 52A wherein the components 10P-1A, 10P-2A, 10P-3A, 10P-4A are mounted using flip chip technology to corresponding electrodes 78A on the substrate 52A. The electrodes 78A can be configured to interconnect the components 10P-1A, 10P-2A, 10P-3A, 10P-4A in a required electrical configuration. The substrate 52A can also include one or more surface mounted capacitors 86A in electrical communication with the components 10P-1A, 10P-2A, 10P-3A, 10P-4A. In addition, the substrate 52A includes terminal contacts 54A, such as solder balls or bumps in a dense grid array, in electrical communication with the electrodes 78A. The terminal contacts 54A are bonded to electrodes 84A on a supporting substrate 80A, such as a printed circuit board. The MCM package 50A and the supporting substrate 80A form an electronic assembly 82A configured to perform a desired electrical function.

Referring to FIGS. 3A–3C, a multi chip module 58 that includes several semiconductor components 10P constructed as previously described with on board capacitors 32 is illustrated. The multi chip module 58 can be configured as a system for performing a specific function such as memory storage. The multi chip module 58 includes a module substrate 60 having patterns of electrodes 64 for flip chip mounting the components 10P to the module substrate 60. As such, the terminal contacts 14 on the components 10P can be bonded to the electrodes 64 on the module substrate 60 using a suitable bonding process, such as solder reflow or thermode bonding. The electrodes 64 are in electrical communication with conductors 62 formed on the module substrate 60 in a required circuit pattern. In addition, the conductors 62 are in electrical communication with an edge connector 66 which provides a connection point from the outside to the multi chip module 58. The on board capacitors 32 contained on the components 10P improve the performance of the multi chip module 58 by filtering transient voltages, spurious signals and power supply noise, substantially as previously described.

Figure 4A:
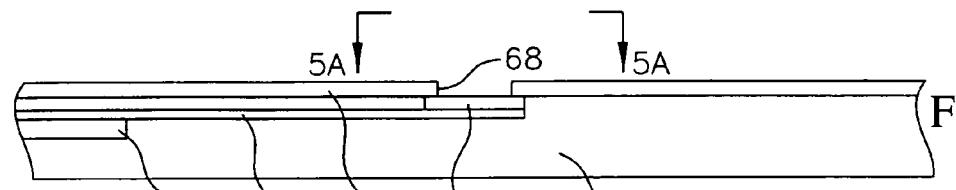
FIGS. 4A–4F are schematic cross sectional views illustrating steps in a method for fabricating the semiconductor component of FIGS. 1A–1E.

Referring to FIGS. 4A–4F and 5A–5F, a method for fabricating the component 10P is illustrated. Initially, as shown in FIG. 4A, the semiconductor die 12 is provided. For simplicity, only a portion of the die 12 is illustrated. Preferably, the die 12 is contained on a semiconductor wafer containing a plurality of identical dice, and the fabrication steps are performed on all of the dice on the wafer.

Figure 5A:
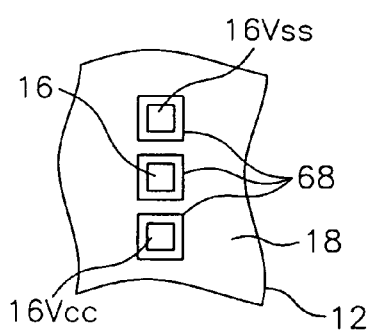
FIG. 5A is view taken along line 5A—5A of FIG. 4A.

Following fabrication, the dice will be singulated into a plurality of separate components 10P. The die 12 includes integrated circuits 24 formed in a semiconducting substrate using techniques that are known in the art. The die 12 also includes internal conductors 22 in electrical communication with the integrated circuits 24. In addition, the die 12 includes the die contacts 16 in electrical communication with the integrated circuits 24. The die contacts 16 can comprise a thin film aluminum layer, or another electrically conductive material. In addition, the die contacts 16 can have a conventional shape (e.g., square or rectangular), a conventional size (e.g., 25 to 200 $\mu$m on a side), and can be arranged in a conventional configuration. As shown in FIG. 5A, the die 12 includes a ground die contact 16Vss and a power die contact 16Vcc. The die 12 also includes the passivation layer 18 which can comprise an electrically insulating material such as BPSG or $SiO_2$. As shown in FIG. 5A, the passivation layer 18 includes openings 68 aligned with the die contacts 16.

Figure 4B:
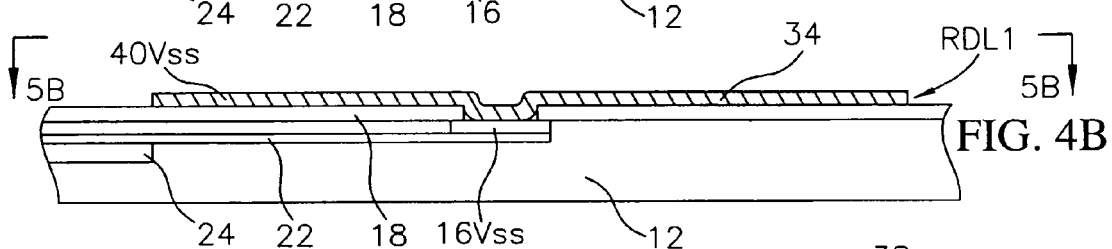

Initially as shown in FIG. 4B, the first (lower) electrode 34 and the ground conductor 40Vss, are formed on the passivation layer 18 in electrical communication with the ground die contact 16Vss. The first (lower) electrode 34 and the ground conductor 40Vss, can be formed using a deposition process such as CVD, PECVD, PVD, sputtering or evaporation, followed by photopatterning and etching. Suitable materials include aluminum, chromium, titanium, nickel, iridium, copper, gold, tungsten, silver, platinum, palladium, tantalum, molybdenum or alloys of these metals, such as $TiSi_2$.

Preferably, the first (lower) electrode 34 and the ground conductor 40Vss, are formed from a first redistribution layer RDL1. Specifically, the first (lower) electrode 34 and the ground conductor 40Vss comprise portions of the first redistribution layer RDL1. Redistribution layers are typically used in semiconductor manufacture to "fan out" the signals from standard die contacts 16, to contacts of a dense area array, such as a ball grid array (BGA). In an ideal situation, the die 12 would be designed to have the die contacts 16 in a pattern that does not require the redistribution layer RDL1 to be added. For example, a semiconductor manufacturer can design the die 12 and the die contacts 16 such that the die contacts 16 are already in a grid array, for attaching solder balls of a ball grid array (BGA). However, as this ideal situation does not always exist, redistribution layers are widely used in semiconductor manufacture.

Figure 5B:
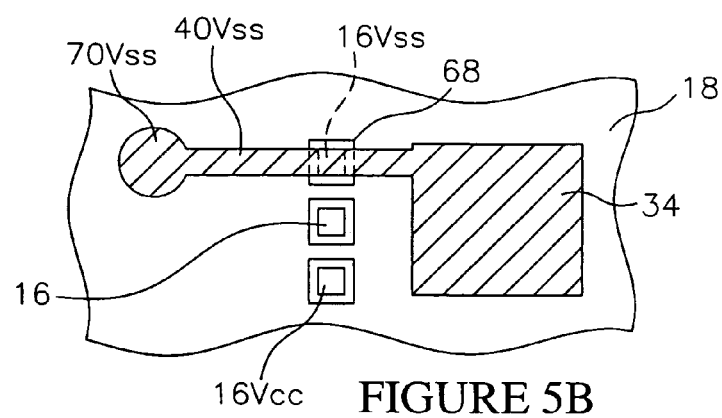
FIG. 5B is a cross sectional view taken along line 5B—5B of FIG. 4B.
Figure 5C:
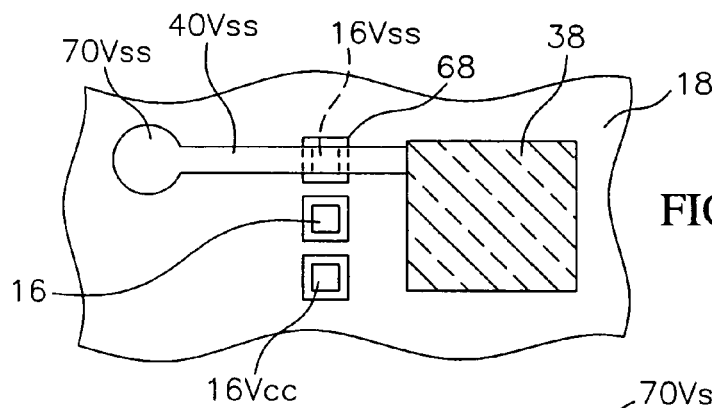
FIG. 5C is a cross sectional view taken along line 5C—5C of FIG. 4C.

In addition to forming the first (lower) electrode 34 and the ground conductor 40Vss, the redistribution layer RDL1 can be used to form the conductors 44 (FIG. 1C) for the remaining die contacts 16, and pads 70 (FIG. 1C) on the conductors 44 for bonding the terminal contacts 14. As shown in FIG. 5B, the first (lower) electrode 34 and the ground conductor 40Vss, are in electrical communication with the ground die contact 16Vss. In addition, the ground conductor 40Vss includes a pad 70Vss for bonding the ground terminal contact 14Vss.

Figure 4C:
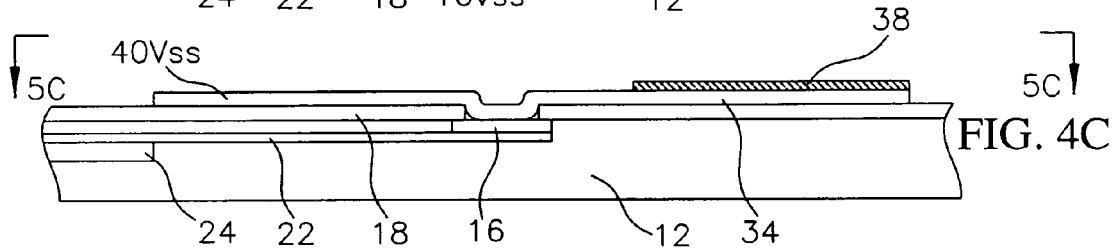

Next, as shown in FIG. 4C, the dielectric layer 38 for the capacitor 32 can be formed on the first (lower) electrode 34. The dielectric layer 38 is sized to separate the first (lower) electrode 34 from the second (upper) electrode 36 by a precise distance (d). The value of the capacitance (C) of the capacitor 32 is a function of the distance (d), the area (A) of the dielectric layer 38, and the dielectric constant or permittivity (E). These parameters can be related by the well known formula C=E A/d. Depending on the application, the value of C can be selected from micro farads ($\mu$F) to pico farads (pF).

The dielectric layer 38 can comprise a thin film dielectric material having a desired dielectric constant (E). Suitable dielectric materials include polymers, oxides, nitrides, ceramics or other high dielectric materials. For example, tantalum pentoxide ($Ta_2O_5$), aluminum oxide ($Al_2O_3$), and barium stronite titanate (BST) are suitable dielectric materials. Depending on the material a suitable process such as deposition by CVD (chemical vapor deposition), PECVD (plasma enhanced chemical vapor deposition), sputtering or LAD (atomic layer deposition) can be used to form the dielectric layer 38. Also depending on the material, a curing step, such as heating at a selected temperature for a selected time period, may also be required.

Figure 4D:
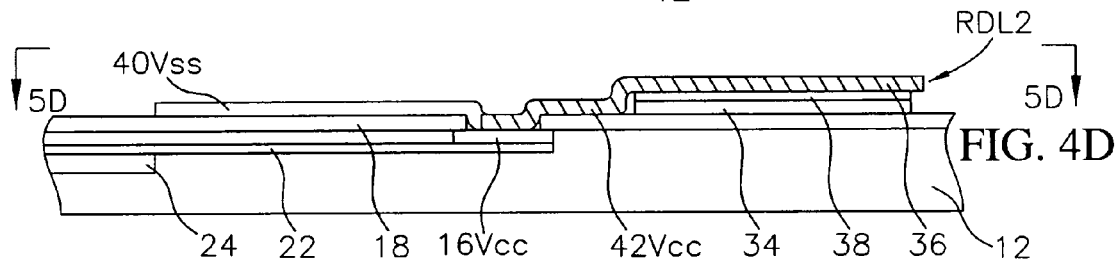

Next, as shown in FIG. 4D, the second (upper) electrode 36 and the power conductor 42Vcc, are formed on the dielectric layer 38 in electrical communication with the power die contact 16Vcc. The second (upper) electrode 36 and the power conductor 42Vcc, can be formed using a deposition process such as CVD, PECVD, PVD, sputtering or evaporation, followed by photopatterning and etching. Suitable materials include aluminum, chromium, titanium, nickel, iridium, copper, gold, tungsten, silver, platinum, palladium, tantalum, molybdenum or alloys of these metals, such as $TiSi_2$.

Figure 5D:
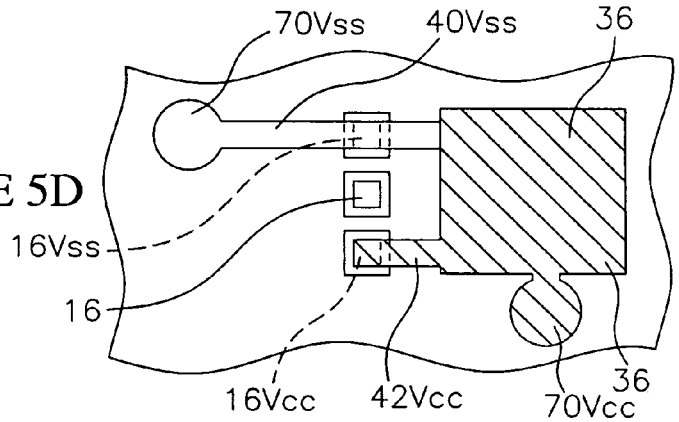
FIG. 5D is a cross sectional view taken along line 5D—5D of FIG. 4D.

Preferably, the second (upper) electrode 36 and the power conductor 42Vcc, are formed from a second redistribution layer RDL2. Specifically, the second (upper) electrode 36 and the power conductor 42Vcc comprise portions of the second redistribution layer RDL2. As shown in FIG. 5D, the second (upper) electrode 36 includes a pad 70Vcc for the power terminal contact 14Vcc.

Figure 4E:
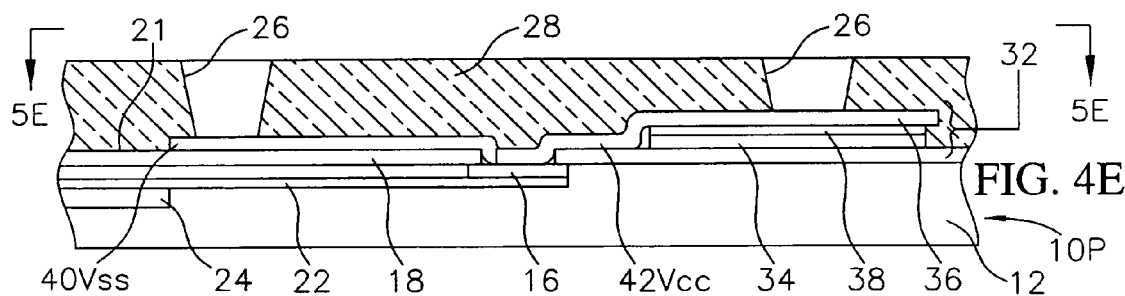

Next, as shown in FIG. 4E, the outer protective layer 28 can be formed over the face 21 of the die 12 to encapsulate the capacitor 32 and associated conductors 40VSS, 42Vcc. The outer protective layer 28 can comprise a deposited polymer, such as polyimide, a glass, such as BPSG, or an oxide such as $SiO_2$. The outer protective layer 28 can also comprise a photoimageable material, such as photoimageable polyimide, that can be blanket deposited as a wet or dry film, exposed through a mask, developed, and then cured.

Figure 5E:
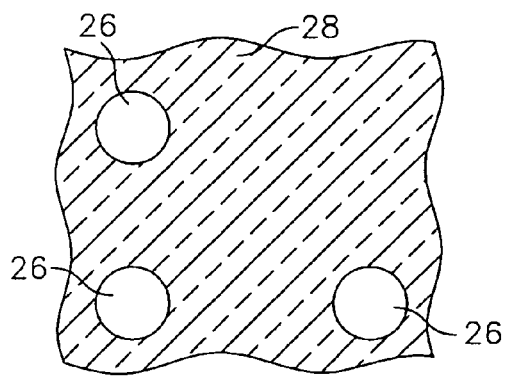
FIG. 5E is a cross sectional view taken along line 5E—5E of FIG. 4E.

As shown in FIG. 5E, the outer protective layer 28 includes the openings 26 for the terminal contacts 14 in a required pattern and with required diameters. The openings 26 align with the pads 70 for the terminal contacts 14. The openings 26 can be formed using an etchant and a mask, such as a photoimageable resist mask. Alternately, if the outer protective layer 28 comprises a photoimageable material, the openings 26 can be formed by exposure and development. In the illustrative embodiment, the outer protective layer 28 also functions as a solder mask to prevent bridging of solder material between the terminal contacts 14 during fabrication of the component 10P, and during flip chip mounting of the component 10P.

Figure 4F:
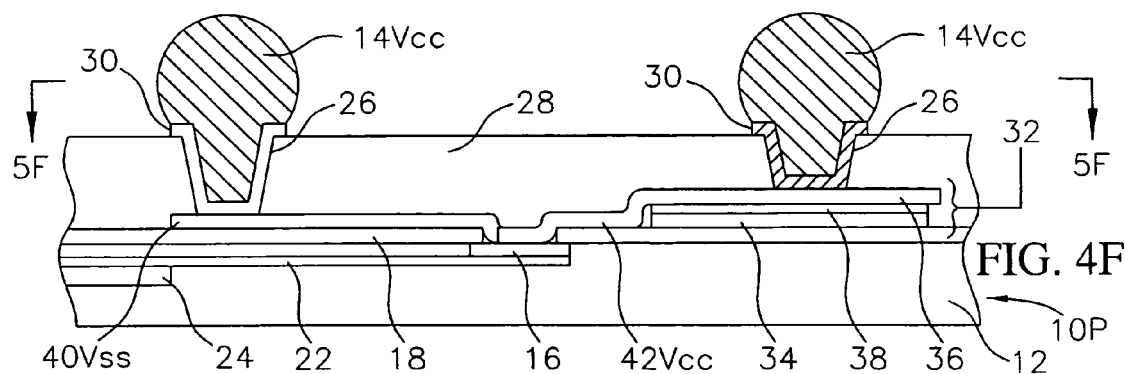
Figure 5F:
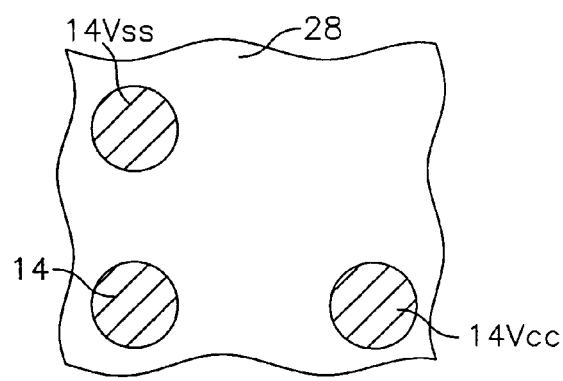
FIG. 5F is a cross sectional view taken along line 5F—5F of FIG. 4F.

Next, as shown in FIGS. 4F and 5F, the terminal contacts 14, including the ground terminal contact 14Vss and the power terminal contact 14Vcc, can be formed in the openings 26 in electrical communication with the pads 70. Prior to forming terminal contacts 14, the under bump metallization layers 30 can be formed in the openings 26 and bonded to the pads 70. The under bump metallization layers 70 can comprise a suitable metal, such as copper, nickel, gold, palladium and molybdenum, formed using a suitable deposition process, such as CVD.

The terminal contacts 14 can be formed of a metal, such as a solder alloy. For example, the terminal contacts 14 can comprise a solder alloy, such as 95% Pb/5% Sn, 60% Pb/40% Sn, 62% Pb/36% Sn/2% Ag, 63% In/37% Sn or other lead free material known in the art. Alternately, the terminal contacts 14 can comprise a conductive polymer such as an isotropic or anisotropic adhesive, or a relatively hard metal such as nickel, copper, beryllium copper, alloys of nickel, alloys of copper, alloys of beryllium copper, nickel-cobalt-iron alloys and iron-nickel alloys.

The terminal contacts 14 can be formed using a reflow process, or by electrolytic deposition or electroless deposition. Another method for forming the terminal contacts 14 is by bonding pre-fabricated balls to the under bump metallization layers 30. A ball bumper can also be employed to bond pre-fabricated balls. A suitable ball bumper is manufactured by Pac Tech Packaging Technologies of Falkensee, Germany. The terminal contacts 14 can also be formed using a conventional wire bonder apparatus adapted to form a ball bond, and then to sever the attached wire.

In addition, the number of terminal contacts 14, the diameter D (FIG. 1A) of the terminal contacts 14, and a pitch P (FIG. 1B) of the terminal contacts 14 can be selected as required. A representative diameter D can be from about 0.005-in (0.127 mm) to about 0.016-in (0.400 mm) or larger. A representative pitch P can be from about 0.004-in (0.100 mm) to about 0.039-in (1.0) mm or more.

Figure 6A:
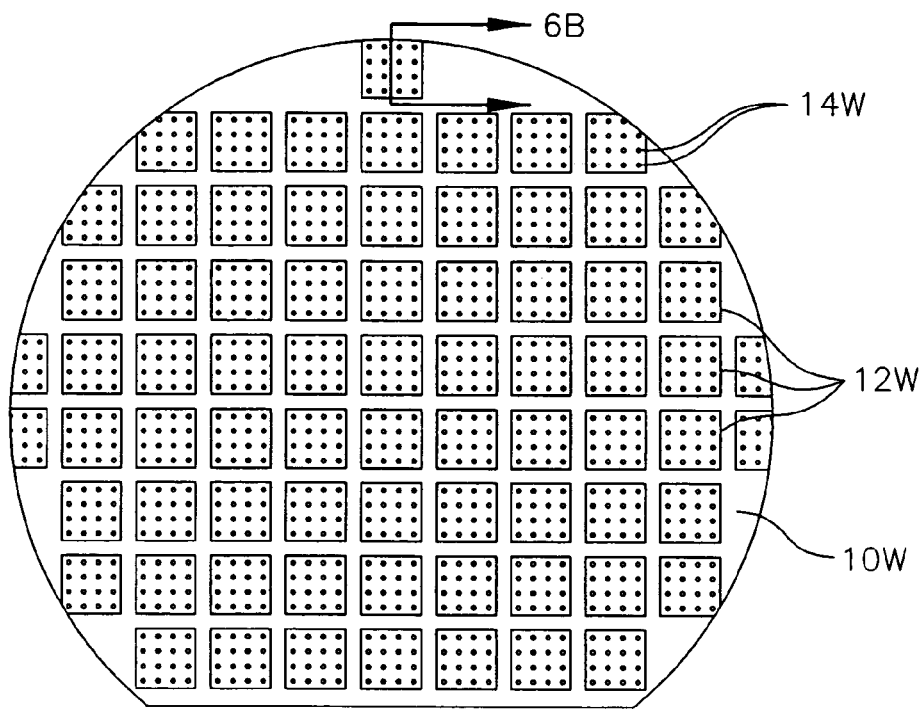
FIG. 6A is a schematic plan view of an alternate embodiment wafer component constructed in accordance with the invention.
Figure 6B:
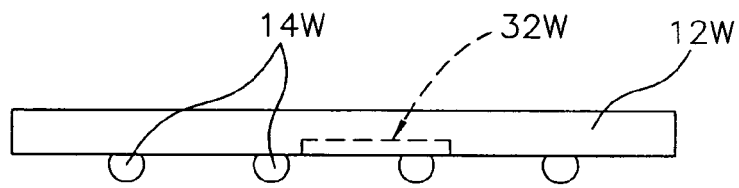
FIG. 6B is a cross section taken along line 6B—6B of FIG. 6A illustrating a die on the wafer component.

Referring to FIGS. 6A–6B, a wafer component 10W constructed in accordance with the invention is illustrated. The wafer component 10W comprises a semiconductor wafer containing semiconductor dice 12W. As shown in FIG. 6B, each die 12W includes an array of terminal contacts 14W. In addition, each die 12W includes an on board capacitor 32W constructed substantially as previously described.

Figure 6C:
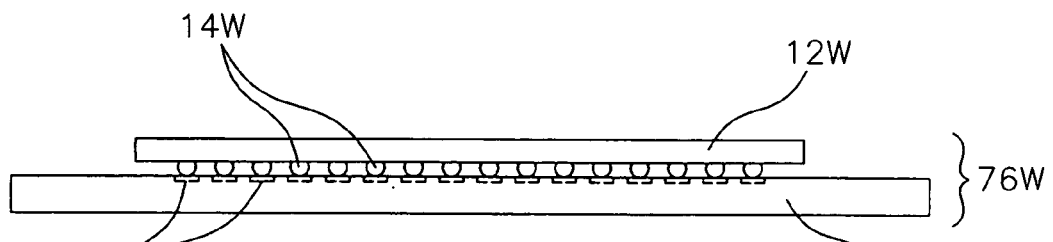
FIG. 6C is a schematic cross sectional view of an electronic assembly constructed with the wafer component.

Referring to FIG. 6C, an electronic assembly 76W constructed using the wafer component 10W is illustrated. The electronic assembly 76W includes a circuit board 72W and the wafer component 10W flip chip mounted to the circuit board 72W. In addition, the terminal contacts 14W on the wafer component 10W are bonded to electrodes 74W on the circuit board 72W. The capacitors 32W on the wafer component 10W function to reduce transient voltages, spurious signals and power supply noise in signals transmitted to the integrated circuits contained on the dice 12W on the wafer component 10W. In addition, the capacitors 32W improve test procedures performed on the wafer component 10W, particularly wafer level burn-in.

Figure 7A:
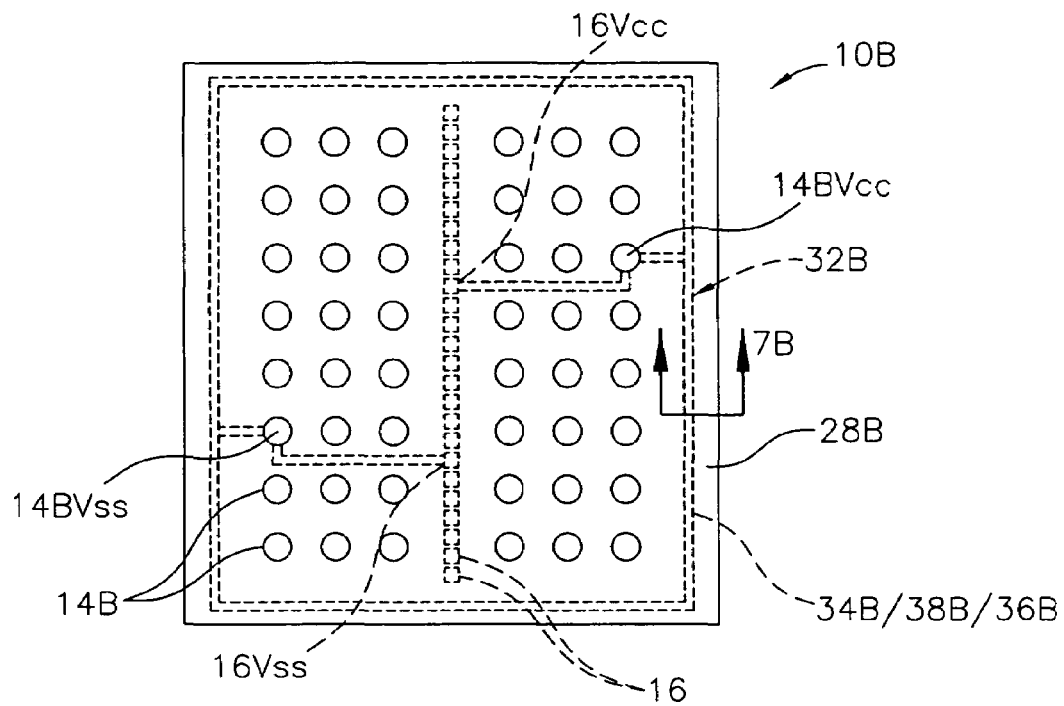
FIG. 7A is a plan view of an alternate embodiment semiconductor component having a peripheral capacitor.
Figure 7B:
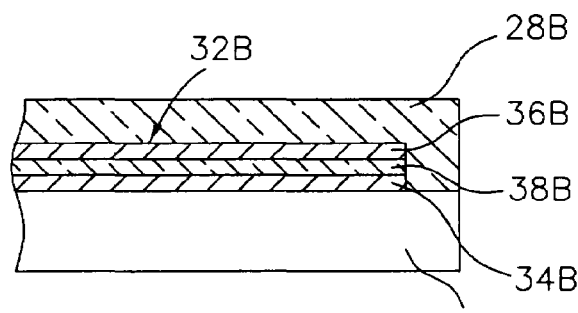
FIG. 7B is an enlarged cross sectional view taken along section line 7B—7B of FIG. 7A illustrating the peripheral capacitor.

Referring to FIGS. 7A and 7B, an alternate embodiment component 10B is illustrated. The component 10B is similar to the previously described component 10P (FIG. 1A), and includes a semiconductor die 12 having a pattern of die contacts 16. The component 10B also includes an array of terminal contacts 14B which include a ground terminal contact 14BVss in electrical communication with a ground die contact 16Vss, and a power terminal contact 14BVcc in electrical communication with a power die contact 16Vcc. In addition, the component 10B includes an outer protective layer 28B.

The component 10B also includes a peripheral capacitor 32B comprising a first (lower) electrode 34B and a second (upper) electrode 36B separated by a dielectric layer 38B. The first (lower) electrode 34B is in electrical communication with the ground terminal contact 14BVss and the ground die contact 16Vss. The second (upper) electrode 36B is in electrical communication with the power terminal contact 14BVcc and with the power die contact 16Vcc. In addition, the first (lower) electrode 34B, the second (upper) electrode 36B and the dielectric layer 38B have a peripheral outline which correspond to, but are slightly smaller than the peripheral outline of the die 12 and the component 10B.

Figure 8:
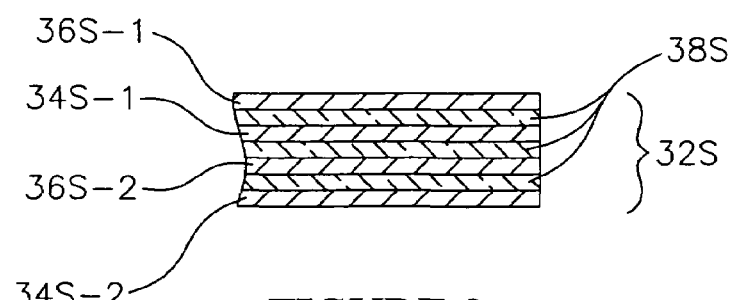
FIG. 8 is an enlarged cross sectional view of an alternate embodiment stacked capacitor having mating pairs of electrodes.

Referring to FIG. 8, an alternate embodiment stacked capacitor 32S is illustrated. The stacked capacitor 32S includes one or more stacked pairs of electrodes 34S-1, 34S-2 and 36S-1, 36S-2. A first pair of first electrodes 34S-1, 34S-2 are in electrical communication with the power terminal contact 14BVcc (FIG. 7A) and with the power die contact 16Vcc (FIG. 7A). A second pair of second electrodes 36S-1, 36S-2 are in electrical communication with the ground terminal contact 14BVss (FIG. 7A) and the ground die contact 16Vss (FIG. 7A). In addition, dielectric layers 38S separate the pairs of electrodes 34S-1, 34S-2 and 36S-1, 36S-2. The pairs of electrodes 34S-1, 34S-2 and 36S-1, 36S-2 can have the configuration of electrodes 34, 36 of FIG. 1C, or the configuration of electrodes 34B, 36B of FIG. 7A. In either case the pairs of electrodes 34S-1, 34S-2 and 36S-1, 36S-2 increase the electrode surface area, and thus the capacitance of the stacked capacitor 32S. In addition, the pairs of electrodes 34S-1, 34S-2 and 36S-1, 36S-2 can comprise deposited metal layers substantially as previously described.

Thus the invention provides improved semiconductor components having on board capacitors, a method for fabricating the components, and systems incorporating the components. While the invention has been described with reference to certain preferred embodiments, as will be apparent to those skilled in the art, certain changes and modifications can be made without departing from the scope of the invention as defined by the following claims.

What is claimed is:

1. A semiconductor component comprising:
a semiconductor die comprising a plurality of die contacts;
at least one redistribution layer on the die configured to redistribute a pattern of the die contacts; and
a plurality of on board capacitors on the die, each capacitor comprising a first electrode comprising a portion of a first redistribution layer, a second electrode comprising a portion of a second redistribution layer, and a dielectric layer separating the first electrode and the second electrode.

2. The component of claim 1 further comprising a plurality of terminal contacts on the die in electrical communication with the capacitors.

3. The component of claim 1 further comprising a protective layer on the die encapsulating the capacitors.

4. The component of claim 1 wherein the component comprises a package.

5. A semiconductor component comprising:
a semiconductor die comprising a plurality of die contacts, the die contained on a semiconductor wafer comprising a plurality of dice identical to the die;
at least one redistribution layer on the die configured to redistribute a pattern of the die contacts; and
a plurality of on board capacitors on the die, each capacitor comprising a portion of the at least one redistribution layer.

6. The component of claim 5 wherein each capacitor includes a first electrode comprising a portion of a first redistribution layer, a second electrode comprising a portion of a second redistribution layer, and a dielectric layer separating the first electrode and the second electrode.

7. The component of claim 5 further comprising a plurality of integrated circuits on the die in electrical communication with the capacitors.

8. The component of claim 5 further comprising a plurality of terminal contacts on the die in electrical communication with the capacitors.

9. The component of claim 5 wherein the component comprises an element of a system in a package.

10. A semiconductor component comprising:
a semiconductor die comprising a first redistribution layer and a second redistribution layer; and
a plurality of capacitors on the die, each capacitor comprising a first electrode comprising a portion of the first redistribution layer, a second electrode comprising a portion of the second redistribution layer, and a dielectric layer separating the first electrode and the second electrode.

11. The component of claim 10 further comprising a protective layer on the die encapsulating the capacitors.

12. A semiconductor component comprising:
a semiconductor die comprising a first redistribution layer and a second redistribution layer;
a plurality of capacitors on the die comprising portions of the first redistribution layer and portions of the second redistribution layer; and
a plurality of integrated circuits and die contacts on the die in electrical communication with the capacitors.

13. A semiconductor component comprising:
a semiconductor die comprising a first redistribution layer and a second redistribution layer;
a plurality of capacitors on the die comprising portions of the first redistribution layer and portions of the second redistribution layer; and
a plurality of terminal contacts on the die in electrical communication with the capacitors.

14. A semiconductor component comprising:
a semiconductor die comprising a first redistribution layer and a second redistribution layer;
a plurality of capacitors on the die comprising portions of the first redistribution layer and portions of the second redistribution layer; and
a protective layer on the die encapsulating the capacitors.

15. The component of claim 14 wherein a first electrode of at least one capacitor is in electrical communication with a ground contact for the die.

16. The component of claim 14 wherein a second electrode of at least one capacitor is in electrical communication with a power contact for the die.

17. The component of claim 14 wherein the terminal contacts comprise elements of a ball grid array.

18. A semiconductor component comprising:
a semiconductor die;
a first redistribution layer on the die and a second redistribution layer on the die; and
a plurality of on board capacitors on the die, each capacitor comprising a first electrode comprising a portion of the first redistribution layer, a dielectric layer on the first electrode, and a second electrode on the dielectric layer comprising a portion of the second redistribution layer.

19. The component of claim 18 further comprising a plurality of terminal contacts on the die in electrical communication with the capacitors.

20. The component of claim 18 further comprising a first power contact on the die in electrical communication with a first capacitor and a second power contact on the die in electrical communication with a second capacitor.

21. The component of claim 18 wherein the die includes a first power contact and a second power contact, and the capacitors include a first capacitor in electrical communication with the first power contact and a second capacitor in electrical communication with the second power contact.

22. A semiconductor component comprising:
a semiconductor die having a peripheral outline;
a first redistribution layer on the die and a second redistribution layer on the die; and
at least one on board capacitor on the die comprising a first electrode comprising a portion of the first redistribution layer, a dielectric layer on the first electrode, and a second electrode on the dielectric layer comprising a portion of the second redistribution layer;
the first electrode and the second electrode having peripheral outlines corresponding to but slightly smaller than the peripheral outline of the die.

23. The component of claim 22 further comprising a plurality of terminal contacts on the die located within the peripheral outlines.

24. The component of claim 22 wherein the component comprises a semiconductor package.

25. The component of claim 22 further comprising a plurality of on board capacitors on the die comprising portions of the first redistribution layer and the second redistribution layer.

26. A semiconductor component comprising:
a semiconductor die;
a capacitor having a peripheral outline and comprising a first electrode comprising a portion of a first redistribution layer on the die, and a second electrode comprising a portion of a second redistribution layer on the die; and
a plurality of terminal contacts on the die located within the peripheral outline.

27. The component of claim 26 wherein the terminal contacts include a first terminal contact in electrical communication with the first electrode, and a second terminal contact in electrical communication with the second electrode.

28. The component of claim 26 further comprising a protective layer on the die encapsulating the capacitors.

29. The component of claim 26 wherein the first die contact comprises a ground contact for the die.

30. The component of claim 26 wherein the second die contact comprises a power contact for the die.

31. The component of claim 26 wherein the terminal contacts comprise a ball grid array.

32. A semiconductor component comprising:
a semiconductor die comprising a plurality of die contacts;
at least one capacitor on the die comprising a first pair of electrodes in electrical communication with a first die contact, a dielectric layer on the first pair of electrodes, and a second pair of electrodes on the dielectric layer in electrical communication with a second die contact; and
a first terminal contact on the die in electrical communication with the first pair of electrodes, and a second terminal contact on the die in electrical communication with the second pair of electrodes.

33. The component of claim 32 wherein the first pair of electrodes comprises a first redistribution layer on the die.

34. The component of claim 32 wherein the second pair of electrodes comprises a second redistribution layer on the die.

35. The component of claim 32 wherein the first pair of electrodes are separated by a first dielectric layer.

36. The component of claim 32 wherein the second pair of electrodes are separated by a second dielectric layer.

* * * * *